(12) United States Patent
Lin et al.

(10) Patent No.: US 12,400,864 B2
(45) Date of Patent: Aug. 26, 2025

(54) METHODS AND SYSTEMS FOR IMPROVING PLASMA IGNITION STABILITY

(71) Applicant: Taiwan Semiconductor Manufacturing Company, Hsinchu (TW)

(72) Inventors: Ping-Hsun Lin, New Taipei (TW); Hung-Yi Tsai, Zhubei (TW); Hao-Ping Cheng, Taichung (TW); Ta-Cheng Lien, Cyonglin (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 323 days.

(21) Appl. No.: 17/732,662

(22) Filed: Apr. 29, 2022

(65) Prior Publication Data

US 2023/0352309 A1  Nov. 2, 2023

(51) Int. Cl.
*H01L 21/3065* (2006.01)
*H01J 37/22* (2006.01)
*H01J 37/32* (2006.01)
*H01L 21/308* (2006.01)
*H05H 1/24* (2006.01)

(52) U.S. Cl.
CPC ......... *H01L 21/3065* (2013.01); *H01J 37/22* (2013.01); *H01J 37/3244* (2013.01); *H01J 37/32477* (2013.01); *H01J 37/32568* (2013.01); *H01L 21/308* (2013.01); *H05H 1/24* (2013.01); *H01J 37/32082* (2013.01); *H01J 2237/334* (2013.01); *H05H 2245/40* (2021.05)

(58) Field of Classification Search
CPC ............... H01J 2237/33; H01J 37/3208; H01J 37/3256; H01J 37/22; H01L 21/3065; H01L 21/308
See application file for complete search history.

(56) References Cited

U.S. PATENT DOCUMENTS

| | | | |
|---|---|---|---|
| 7,141,504 B1* | 11/2006 | Bhardwaj | C07C 17/00 438/719 |
| 2002/0094685 A1* | 7/2002 | Nakata | G01N 21/94 438/689 |
| 2012/0086929 A1* | 4/2012 | Lammers | G03F 7/708 134/1.1 |

(Continued)

FOREIGN PATENT DOCUMENTS

JP  2011071335 A  *  4/2011

OTHER PUBLICATIONS

NIST Chemistry Webbook "Sulfur Hexafluoride" via https://webbook.nist.gov/cgi/cbook.cgi?ID=C2551624&Mask=20 ; pp. 1-11 (Year: 2023).*

(Continued)

*Primary Examiner* — Binh X Tran
(74) *Attorney, Agent, or Firm* — Lippes Mathias LLP

(57) ABSTRACT

Methods for plasma stability in a plasma treatment tool are disclosed. A laser is positioned within a plasma treatment chamber within a skin depth of the electromagnetic field generated therein. The laser can be synchronized with the electrical triggering signals that generate the electromagnetic field. This scheme provides a stable and efficient method of plasma ignition.

20 Claims, 7 Drawing Sheets

(56) References Cited

U.S. PATENT DOCUMENTS

| | | | |
|---|---|---|---|
| 2012/0322239 A1* | 12/2012 | Singh | H01L 21/78 |
| | | | 156/345.35 |
| 2013/0309873 A1* | 11/2013 | Ruzic | H01L 29/66818 |
| | | | 438/735 |
| 2020/0083063 A1* | 3/2020 | Shin | H01L 21/02057 |
| 2022/0115211 A1* | 4/2022 | Liao | H01J 37/32082 |

OTHER PUBLICATIONS

"Relation Between eV and Joule" via https://byjus.com/physics/relation-between-ev-and-joule/ ; pp. 1-9 (Year: 2024).*

Dielectric Constants of Quartz, J Appl Phys 43 via https://pubs.aip.org/aip/jap/article/43/4/1493/506185/Dielectric-Constants-of-Quartz ;pp. 1493-1495 (Year: 1972).*

Wikipedia, "Ultraviolet" via https://web.archive.org/web/20210206034101/https://en.wikipedia.org/wiki/Ultraviolet ; pp. 1-33 (Year: 2021).*

* cited by examiner

METHODS AND SYSTEMS FOR IMPROVING PLASMA IGNITION STABILITY

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device. Plasma treatment is used for various applications in the integrated circuit production process, such as cleaning the wafer or for etching.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
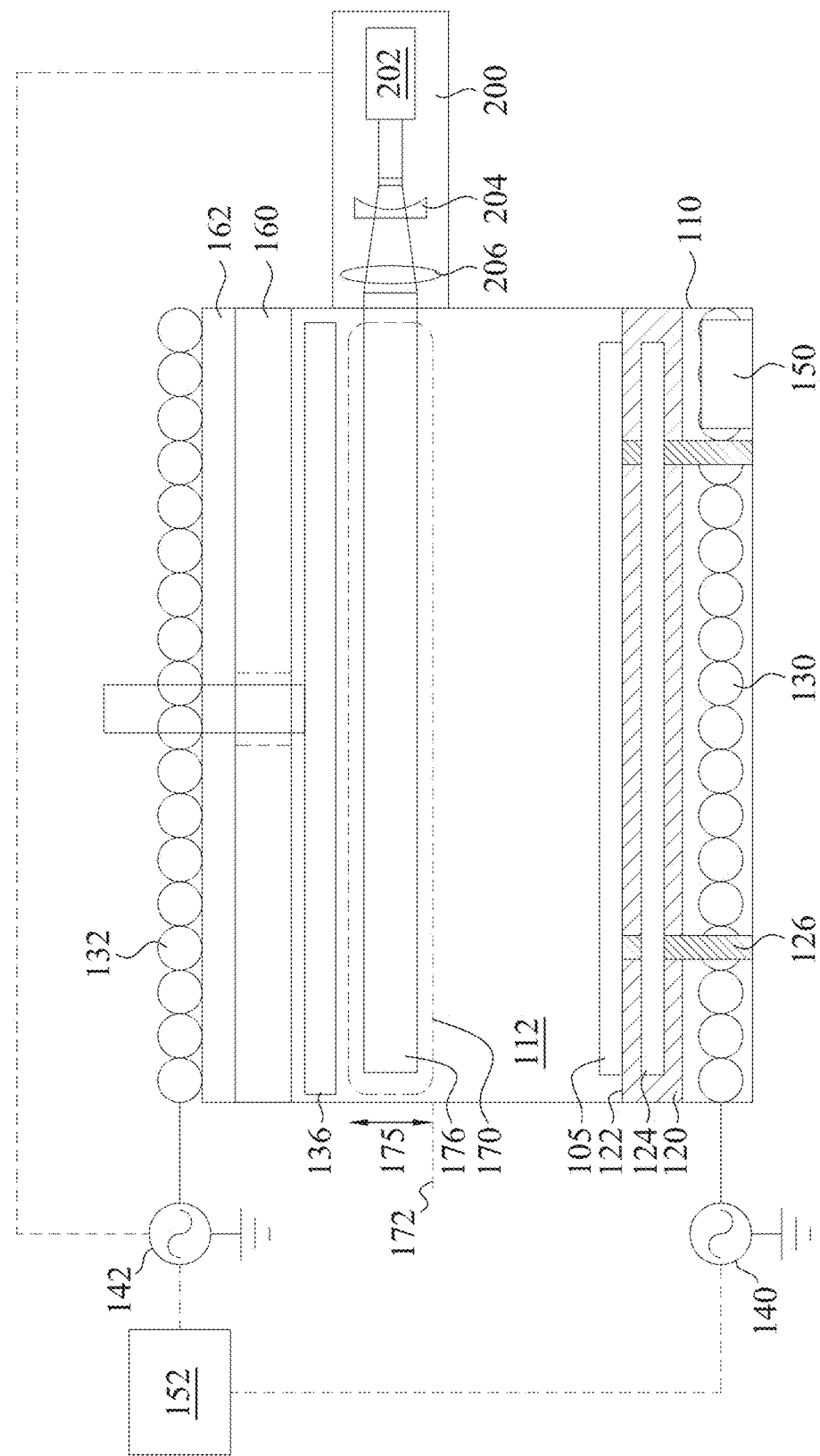
FIG. 1 is a side cross-sectional view of a plasma treatment tool, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the states value by less than the experimental error of conventional measurement technique of the type described in the present application to determine the value. All ranges disclosed herein are inclusive of the recited endpoint.

The present disclosure relates to methods for plasma treatment tools commonly used in integrated circuit fabrication processes. These plasma treatment tools are used in applications such as cleaning of wafer substrates; etching processes; deposition processes; and wafer bonding processes such as fusion bonding. Generally, a radio frequency (RF) magnetic field is produced between two electrodes to contain and control a gas. An electrical field is also produced, which causes an electrical discharge that ionizes the gas molecules and strips them of their electrons, or "ignites" the gas, creating a plasma from the gas. The plasma contains charged ions which bombard the wafer substrate, resulting in the desired functions. Certain etchers use inductively coupled plasma (ICP) or transformer-coupled plasma (TCP) where the electrode(s) is separated from the plasma by a dielectric window. The dielectric window has a protective function, which can also be used to increase plasma uniformity over the wafer substrate. Stable plasma ignition is also important for controlling the various elements of the plasma treatment process. Plasma ignition relies on the electric discharge, and plasma stability is highly related to various operation conditions.

The present disclosure relates to methods and systems for improving the stability of plasma ignition in a plasma treatment tool. In this regard, plasma treatment tools such as ICP etchers often operate in two different modes: E-mode (capacitive mode) and H-mode (inductive mode). The E-mode is sustained by radial and axial electromagnetic fields while the H-mode is sustained by the azimuthal electromagnetic field produced between the two electrodes. Very generally, the E-mode occurs at low electron or plasma density, while the H-mode occurs at high electron or plasma density. The change in density, and thus the transition between E-mode and H-mode, can be handled by RF power matching. However, the transition between E-mode and H-mode is also related to the timing of the electrical discharge that ignites the plasma, which is not well-controlled. And when the plasma treatment tool is operated in a pulsed mode, the RF power matching should be performed with every pulse. In the plasma treatment tools of the present disclosure, plasma ignition is performed using an optical module comprising a laser. The laser provides a fast and stable method for igniting the plasma, and can be easily synchronized with the electrical triggering signals in the plasma treatment tool. Maintenance and downtime is also improved.

FIG. 1 is a side cross-sectional view of an example of a plasma treatment tool 100 that uses plasma for etching, in accordance with some embodiments of the present disclosure.

The plasma treatment tool includes a housing 110 surrounding a plasma treatment chamber 112. A wafer support pedestal 120 is present within the housing and the plasma treatment chamber. The pedestal may be configured to hold a substrate 105, such as a semiconducting wafer substrate, in a desired position. The pedestal 120 includes a support surface 122 which contacts the wafer substrate. The support surface itself is usually made of an electrically insulating material. The substrate is placed on the wafer support surface.

In particular embodiments, the pedestal is in the form of an electrostatic chuck that uses an electrostatic holding force to secure the wafer substrate. As illustrated here, the pedestal includes a chuck electrode 124 located below the support surface 122. Extending through the chuck electrode and the support surface are loading pins 126, which can be used to raise and lower the wafer substrate. In some embodiments, channels may be provided on the back side of the electrostatic chuck for providing gases or fluids to cool the wafer substrate during plasma treatment. In this way, warpage and/or other damage to the wafer substrate may be reduced or minimized.

Alternatively, the pedestal may apply vacuum pressure to hold the wafer substrate in place by suction. As yet another alternative, the pedestal may interact mechanically, for example using clamps or retaining rings or the like, to hold the wafer substrate in place using a mechanical holding force.

Continuing, a lower electrode 130 is located below the wafer support surface, and an upper electrode 132 is located above the wafer support surface 122/pedestal 120. A dielectric window 160 is also located above the wafer support pedestal. The dielectric window 160 is located between the wafer support pedestal 120 and the upper electrode 132, and physically separates the upper electrode from the interior of the plasma treatment chamber 112. Similarly, the lower electrode 130 may also be isolated from the interior of the plasma treatment chamber. The electrodes may be, for example, in the shape of a planar coil. The electrodes are used to generate a magnetic field for containing and controlling the plasma. The dielectric window 160 is also intended to reduce the strength or depth of the induced electrical field 170 within the plasma treatment chamber. If desired, a Faraday shield 162 can also be placed between the chamber 112/dielectric window 160 and the upper electrode 132 to improve such shielding.

The dielectric window 160 can be made from a dielectric material, for example a ceramic such as aluminum oxide ($Al_2O_3$) or silicon dioxide ($SiO_2$), or anodized aluminum (aluminum that has been treated to form a surface layer of $Al_2O_3$). A protective coating can be applied to the inner surface of the dielectric window, such as yttrium oxide ($Y_2O_3$), yttrium trifluoride ($YF_3$), yttrium oxyfluoride (YOF), or yittrium aluminum garnet (YAG). The Faraday shield 162 can be made from an electrically conductive material, which can be a metal such as aluminum or copper.

The plasma treatment system also includes a gas inlet 136, through which one or more process gases are introduced into the plasma treatment chamber and which is illustrated here as a showerhead. The gas inlet and/or gas lines for supplying the process gases can pass through the top of the plasma treatment chamber and the various components located there. The gas inlet and/or gas lines are connected to gas sources (not shown) for providing the specified gas. One or more gas outlets 150 is also present for removing undesired gases, and for reducing the pressure within the reaction chamber. A gas outlet can be connected to a pump (not shown) for creating vacuum. A door (not shown) is also present for accessing the plasma treatment chamber, to insert and remove the wafer substrate.

At least one radiofrequency (RF) generator is present for applying RF power. Here, a lower RF generator 140 is coupled to the lower electrode 130 to provide RF bias power, and an upper RF generator 142 is coupled to the upper electrode 132 to provide RF source power.

An optical module 200 is present within the plasma treatment system 100. The optical module 200 contains an optical ignitor 202, which is directed towards the plasma treatment chamber 112 and which uses light to ignite the process gas(es) to generate the plasma. The optical module is generally positioned so that the light path generated by the optical ignitor 102 passes between the dielectric window 160 on one side and the wafer support pedestal 120 or the lower electrode 130 on the other side.

As previously mentioned, the upper electrode 130 also induces an electrical field 170 within the plasma treatment chamber 112. The electrical field 170 or the chamber 112 can be said to have a skin depth 172, which is the depth below the surface of a conductor (i.e. upper electrode 130) where the value of the current is 1/e (0.37) times the value of the current at the surface. In particular embodiments, the optical module is positioned so that the light path 176 generated by the optical ignitor 102 passes between the dielectric window 160 and the skin depth 172, which is indicated by height 175. The entire light path or some portion of the light path may pass through this height 175. As illustrated herein, the light path is directed horizontally, however this is not required and the light path, for example, could also travel at an angle relative to the dielectric window.

In particular embodiments, the optical ignitor is a laser. The laser may generally be any type of laser. In particular embodiments, the laser is an ultra-short pulse laser, a high-power laser, or a short-wavelength laser. An ultra-short pulse laser is capable of emitting ultrashort pulses of light, for example with a pulse width on the order of femtoseconds up to about one picosecond. A high-power laser has a peak power output of at least one gigawatt. A short-wavelength laser operates at a wavelength below 400 nanometers. It is noted that these three categories are not mutually exclusive—a given laser may be capable of emitting ultrashort light pulses, and have a peak power output of at least one gigawatt, and operate at a wavelength below 400 nm.

In particular embodiments, the laser can operate at a wavelength of about 400 nm or lower. In additional embodiments, the laser can emit optical pulses with an energy of about 20 millijoules (mJ) to about 1 joule, such as about 50 mJ. In still more embodiments, the laser can emit optical pulses with a duration (or pulse width) of about one picosecond or less. In more desirable embodiments, the laser can emit optical pulses with a pulse width of about 20 femtoseconds to about 60 femtoseconds, such as about 40 femtoseconds. In continuing embodiments, the laser can emit optical pulses at a frequency of about 0.1 kilohertz (KHz) to about 100 megahertz (MHz). In still other embodiments, the laser has a peak power output of about 1 terawatt. Any combination of two or more of these properties (wavelength, energy, pulse width, frequency, peak power output) is contemplated. As illustrated here, the optical module/optical ignitor/laser can be synchronized with the RF signal of the upper RF generator 142, either directly or through controller 152. This permits the laser firing to be matched with the RF power, improving plasma stability.

The laser may be any type of laser, such as a gas laser, a solid state laser, a fiber laser, a photonic crystal laser, a semiconductor laser, a dye laser, or a free-electron laser. It is noted that these types are also not mutually exclusive, and a given laser may fall within one or more of these types.

In a gas laser, an electric current is discharged through a gas to produce coherent light. One type of gas laser is an excimer laser, which is powered by a chemical reaction involving an excited dimer, usually a combination of a noble gas and a reactive gas. Several types of excimer lasers are used for photolithography, such as KrF or ArF excimer lasers at wavelengths of 248 nm and 193 nm. Another type of gas laser is a chemical laser, which obtains its energy from a chemical reaction to produce coherent light. A solid state laser uses a solid gain medium, such as Nd:YAG. The frequency of these gain mediums may be multipled to obtain a wavelength of 400 nm or below. A fiber laser is a type of solid state laser where the gain medium is in the form of an optical fiber. The coherent light is both generated and delivered within the fiber. In a semiconductor laser, a laser beam is created at the junction of a diode under appropriate conditions. A photonic crystal laser is a type of semiconductor laser that uses a photonic crystal to produce the laser beam. A dye laser uses an organic dye as the gain medium. A free-electron laser essentially uses electrons as the gain medium.

In particular embodiments, the laser used in the optical module is an excimer laser, a solid state laser, a semiconductor laser, or a fiber laser.

Additional optical components may also be present in the optical module for controlling the output of the optical ignitor 202. As non-limiting examples, a beam expander 204 and a beam flattener 206 are illustrated as being present in the optical module for changing various properties of the optical beam. The beam expander may be used to increase or decrease the diameter of the optical beam. In some embodiments, the beam expander is a reflective expander, which uses mirrors to expand the beam. A beam flattener may be used, for example, to change the intensity of the laser beam (power per unit area) from a Gaussian distribution to a more uniform distribution over the entire area of the optical beam. Such components are known in the art.

The photon energy produced by the optical ignitor 202 should be greater than the ionization threshold of the process gas(es) in the plasma treatment chamber (i.e. the highest ionization threshold of all of the process gases present). For example, the ionization threshold of argon (Ar) is about 15.8 electron-volts (eV), while the threshold for helium is 24.6 eV. This permits optical-field ionization or multi-photon ionization to occur, igniting the gas(es) and creating the plasma.

Continuing with FIG. 1, the controller 152 is used to control the various inputs and outputs (as indicated with dashed lines), and to measure various conditions within the housing for the plasma treatment process. The system may also include sensors (not shown) for monitoring applicable parameters. For example, such sensors may include those for tracking the flow rate of various gases, for measuring the content of gases exiting the chamber, for measuring the pressure within the chamber, the temperature of the wafer substrate, etc. The controller can also determine whether to activate or deactivate the system, how to vary the voltage to the electrodes and control the firing of the optical ignitor/ laser, how to vary the gas mixture, and potentially also control the motion of any automated handling system that may be present, etc. It is noted that these various parameters may not have to be held steady during operation, and could be changed by the controller operating a computer program which alters their setpoints as appropriate. The controller may also include a user interface for communicating with operators.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

The various components of the plasma treatment system may be made using materials and processes known in the art. Examples of suitable materials can include metals, plastics, etc. Common enhancements may also be used. For example, the various surfaces within the plasma treatment chamber may include a protective coating.

Figure 2:
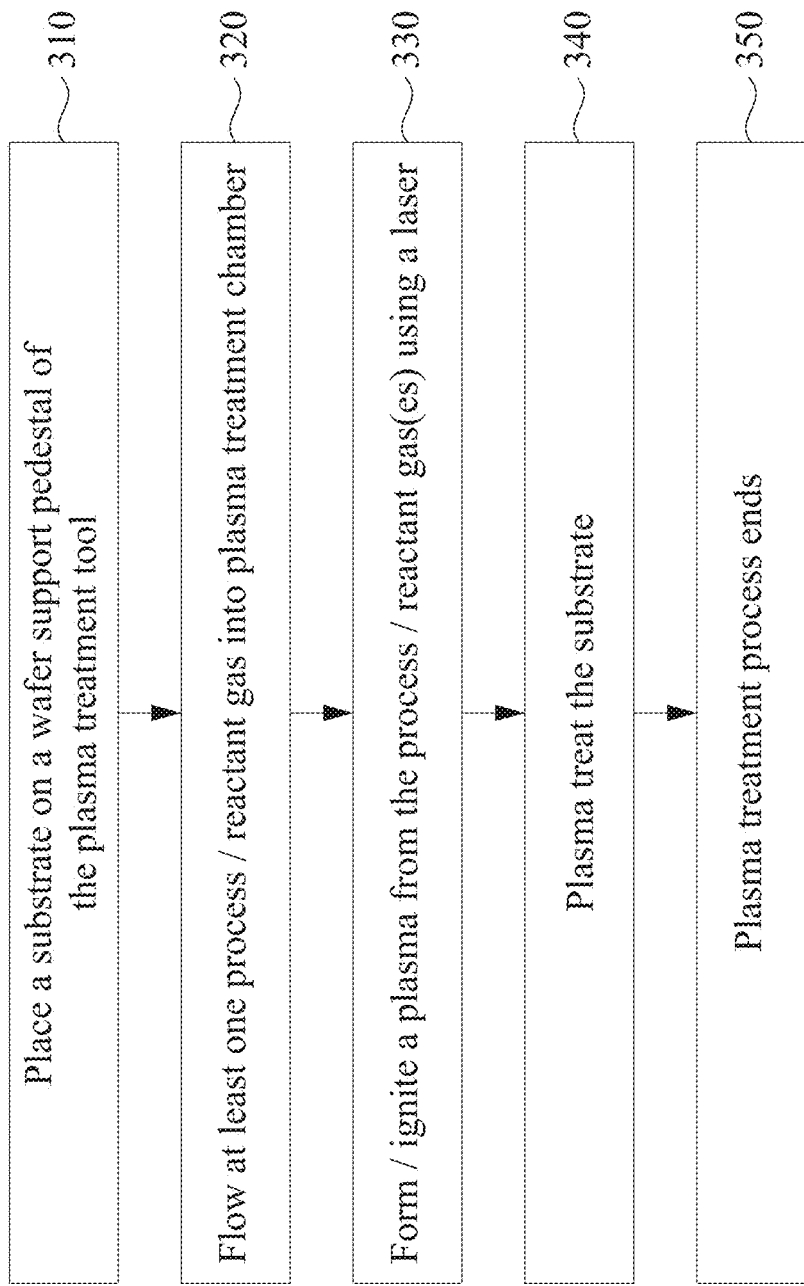
FIG. 2 is a flowchart illustrating a method for using a plasma treatment tool, in accordance with some embodiments of the present disclosure.
Figure 3:
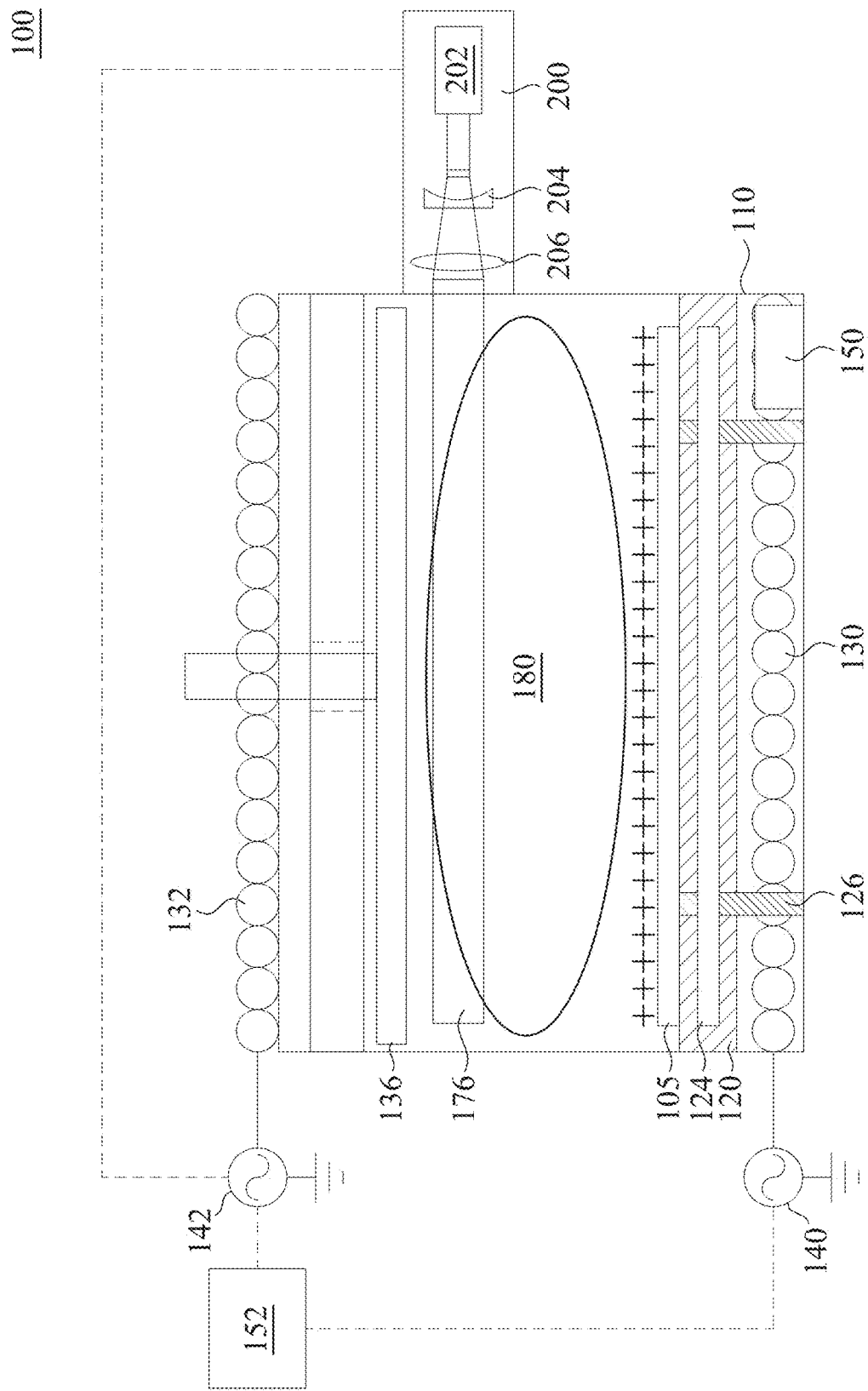
FIG. 3 is a side cross-sectional view illustrating an optical ignitor/laser being used to ignite process gas(es) to form a plasma, and the resulting plasma treatment.
Figure 4:
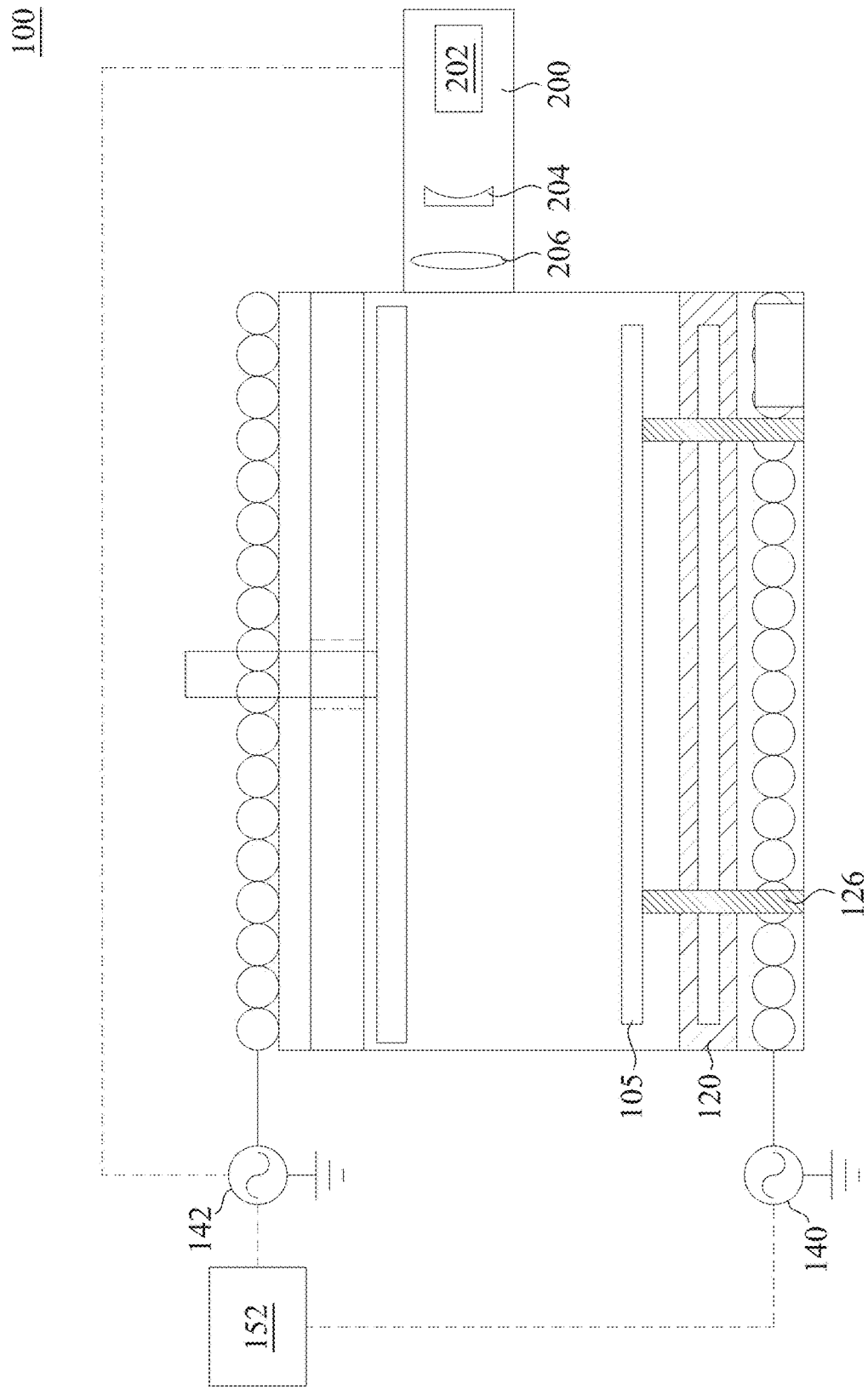
FIG. 4 is a side cross-sectional view showing the plasma treatment tool of FIG. 3 after plasma treatment.
Figure 5:
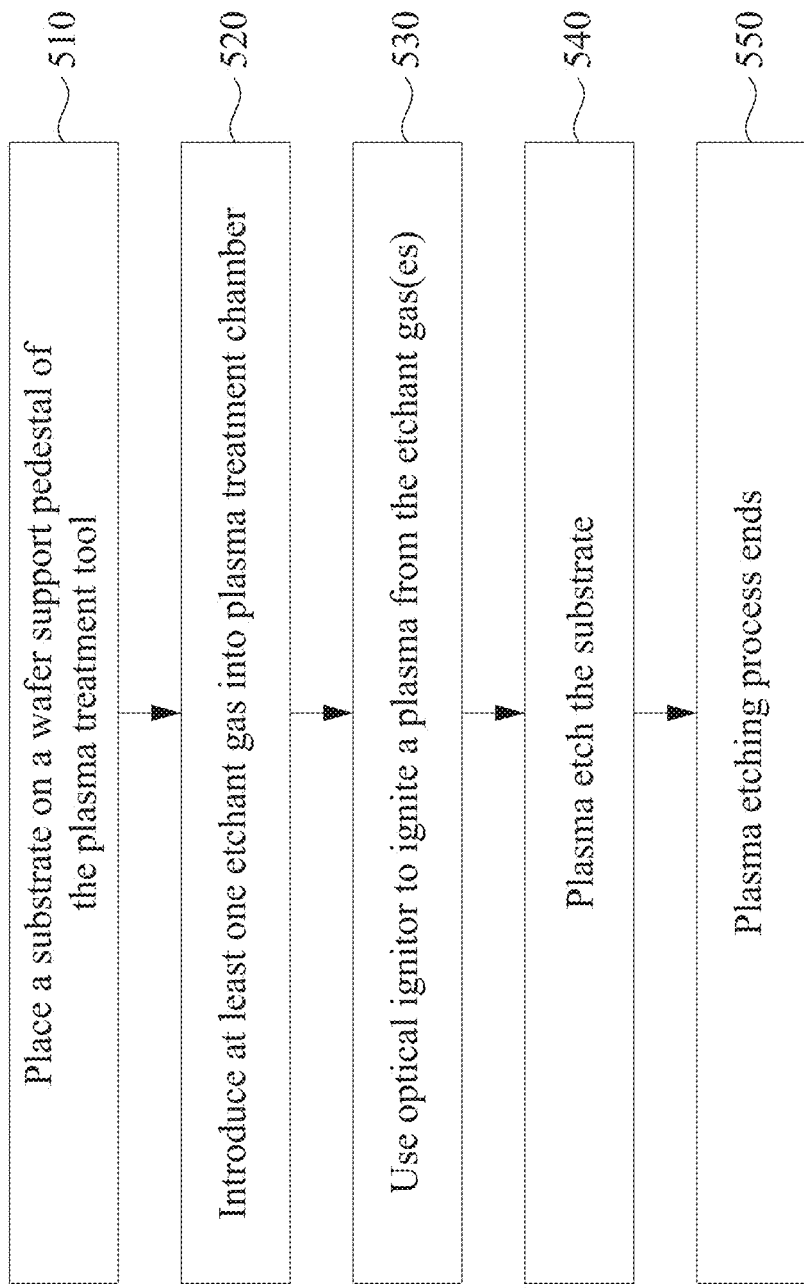
FIG. 5 is a flowchart illustrating a method for plasma etching, in accordance with some embodiments of the present disclosure.

FIG. 2 is a flowchart illustrating a method for using a plasma treatment tool like that of FIG. 1, in accordance with some embodiments of the present disclosure. Some of the method steps are illustrated in FIGS. 3-5. The plasma treatment tool can be used, for example, for plasma etching and/or mask etching.

First, in step 310, and referring to FIG. 1, a substrate 105 is placed on a wafer support pedestal 120 of the plasma treatment tool 100. The plasma treatment tool includes an optical module 200 with an optical ignitor 202, which is positioned as previously described.

In some embodiments, the substrate can be made a wafer made of any semiconducting material. In some embodiments, these materials may be silicon, for example in the form of crystalline Si or polycrystalline Si. In another embodiment, the substrate may be made of other elementary semiconductors such as germanium, or may include a compound semiconductor such as silicon carbide (SiC), gallium arsenide (GaAs), indium arsenide (InAs), and indium phosphide (InP). A patterned photoresist layer may be present upon the substrate to control the exposure of various areas of the substrate.

In other embodiments, the substrate is a mask substrate. The mask substrate is typically a quartz or glass substrate, upon which an optional phase shifting film can be deposited. A chromium film is then deposited upon the phase shifting film. An optional anti-reflective coating can be deposited upon the chromium film, and finally a photoresist layer is deposited upon the optional anti-reflective coating. The photoresist layer is patterned and then developed.

Next, in step 320, at least one process gas or reactant gas is introduced or flowed into the plasma treatment chamber 112 through the gas inlet 136. Depending on the application, for example, the process gases may include nitrogen ($N_2$), hydrogen ($H_2$), argon (Ar), helium (He), fluorine ($F_2$), chlorine (Cl), oxygen ($O_2$), hydrogen bromide (HBr), hydrofluoric acid (HF), nitrogen trifluoride (HF), or sulfur hexafluoride ($SF_6$), or hydrofluorocarbons of the general formula $C_xH_yF_z$ such as trifluoromethane ($CHF_3$) or tetrafluoromethane ($CF_4$).

In step 330, the optical ignitor/laser 202 is used to ignite a plasma 180 from the process gas(es) or reactant gas(es). This is illustrated in FIG. 3, with light path 176 passing through the plasma. The photon energy produced by the optical ignitor is greater than the ionization threshold of all of the process gas(es) in the plasma treatment chamber. The resulting plasma is a mixture of electrons, neutral species, and positively and/or negatively charged ions.

In step 340, the substrate 105 is plasma treated. This is also illustrated in FIG. 3. The plasma treatment can be performed, for example, as part of a dielectric barrier discharge (DBD) process, a reactive ion etching (RIE) process, or a sequential plasma (SPAB) process. Voltage provided by the RF generators 140, 142 is applied between the upper electrode 132 and the lower electrode 130 to produce a magnetic field for controlling the plasma 180. The radiofrequency is usually operated at 13.56 megahertz (MHz), although other frequencies such as 2 MHz or 60 MHz may be used, depending on the application. In broad embodiments, the radiofrequency can range from as low as 0.1 kilohertz (kHz) to about 100 megahertz (MHz), including from about 1 kHz to about 5 kHz. The power used to generate the plasma may range from about 10 watts (W) to about 2,000 W.

In this regard, it is noted that desirably, the optical ignitor/laser is operated at the same frequency as the two electrodes. Conceptually, the laser ignites the gas(es) at this frequency to produce the plasma in a manner similar to the way in which extreme ultraviolet light is produced by high-frequency laser heating of and plasma generation from tin droplets. This is particularly useful for pulsed plasma etching, where the power is modulated in time. For example, square wave modulation is applied to the upper electrode and/or the lower electrode. The use of pulsed plasma etching can result in a higher etching rate, improved etch selectivity, better uniformity, and less damage to the wafer substrate. In addition, undesirable artifacts such as notching, bowing, micro-trenching, and aspect ratio dependent etching may be reduced.

As one non-limiting example, the optical ignitor may be operated to provide a pulse energy of about 50 mJ and a pulse width of about 40 femtoseconds, resulting in a peak power of approximately 1 terawatt. During the plasma treatment of step 340, then, steps 320 and 330 may be considered as continuously occurring at a specified frequency (in other words over multiple ignition cycles). The optical ignitor can also be used in continuous wave (CW) etching, which only has one ignition cycle.

In some embodiments, the plasma treatment is performed in a vacuum environment, for example with the pressure within the plasma treatment chamber being from about 0.1 pascals (Pa) to about 100 Pa or up to about 1.3 kPa (approximately 10 millitorr). However, the pressure may be higher and could simply be sub-atmospheric, for example a pressure of about 10 kPa to about 95 kPa (for comparison, atmospheric pressure is about 101 kPa). During the plasma treatment process, the temperature in the plasma treatment chamber 112 just above the substrate may be in the range of about 70° C. to about 80° C. Due to the plasma treatment, a residual voltage may remain on the wafer substrate, indicated here as a positive charge on the wafer substrate 105.

In step 350, the plasma treatment process ends. In FIG. 4, the plasma treatment is complete. The loading pins 126 are raised to elevate the substrate 105 above the pedestal 120. The loading pins now contact the bottom of the substrate to dissipate any residual charge on the substrate. Automated handling tools (not shown) can then grasp the substrate to a subsequent processing tool.

FIG. 5 is a flowchart illustrating a method for plasma etching, in accordance with some embodiments of the present disclosure. Some of these method steps are also illustrated in FIG. 3 and FIG. 4.

In step 510, referring to FIG. 1, a substrate 105 is placed on a wafer support pedestal 120 of the plasma treatment tool 100. In step 520, at least one etchant gas is introduced into the plasma treatment chamber. In step 530, an optical ignitor/laser 202 is used to ignite a plasma 180 from the at least one etchant gas. This is illustrated in FIG. 3, with light path 176 passing through the plasma. In step 540, the substrate is plasma etched. This is illustrated in FIG. 3. In step 550, the plasma etching process ends. This is illustrated in FIG. 4.

Generally speaking, any tool that uses plasma can be improved with the addition of the optical ignitor/laser, as the benefits of increased plasma stability apply. For example, the plasma treatment tool may be used for plasma-enhanced chemical vapor deposition (PECVD). In many PECVD devices, a semiconducting wafer substrate is inserted into a deposition/reaction chamber. One or more reactant gases are injected into the deposition/reaction chamber through an assembly that includes a showerhead, and is typically located above the wafer substrate. The reactant gas(es) can be converted to plasma using the optical ignitor. The exposure of the substrate to the plasma results in chemical reaction and deposition on the substrate, for example to form a thin film which is used as a component of a semiconductor device. It may be possible to produce the plasma remotely in a separate chamber, then introduce the plasma into the deposition/reaction chamber containing the wafer substrate.

As another example, the plasma treatment tool can be used for performing dry etching. Dry etching can be used to form trenches and/or vias in a layer, and is a highly anisotropic process for obtaining high aspect ratios (i.e. predominantly vertical walls). For dry etching, for example, a patterned photoresist layer is present over a metal layer on the wafer substrate. The plasma treatment tool is then used to etch the exposed metal. Etch products may include for example, FCN, $CO_x$, $SiCl_x$, and/or $SiF_x$. The etching may be performed, for example, on a mask substrate to obtain a photomask.

Figure 6A:
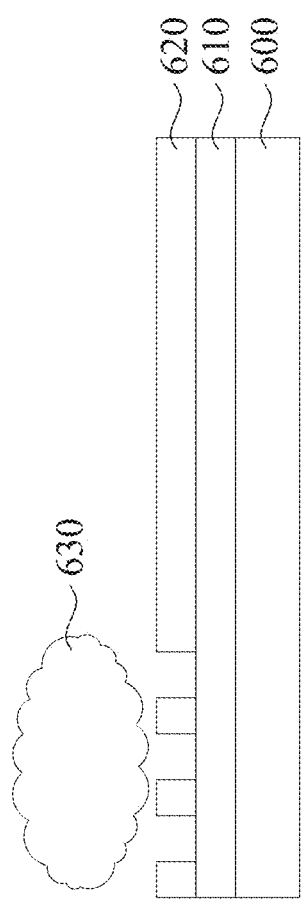
FIG. 6A and FIG. 6B are diagrams illustrating a dry etching process performed using a plasma treatment tool, in accordance with some embodiments.
Figure 6B:
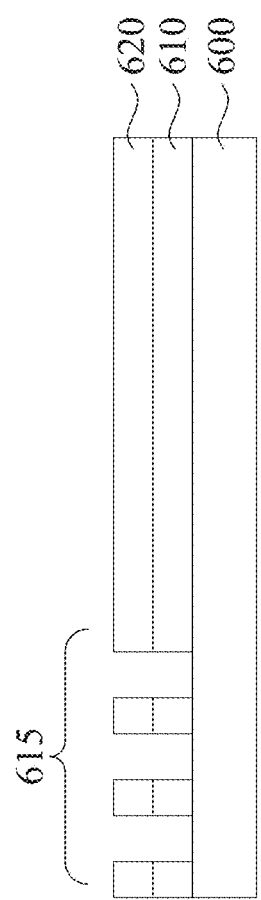

FIG. 6A and FIG. 6B are side cross-sectional views illustrating the dry etch process. In FIG. 6A, a metal layer 610 is present on a silicon substrate 600, and a photoresist layer 620 upon the metal layer has been patterned. The metal layer is then dry etched using plasma 630. Referring now to FIG. 6B, trenches 615 are now present in the metal layer.

The plasma treatment tool can also be used for cleaning. The plasma treatment can remove contaminants from the surface of a wafer substrate. In addition, the surface is made hydrophilic by increasing the number of —OH groups on the surface, which may be beneficial for forming strong fusion bonds when wafer-to-wafer bonding is desired.

Figure 7:
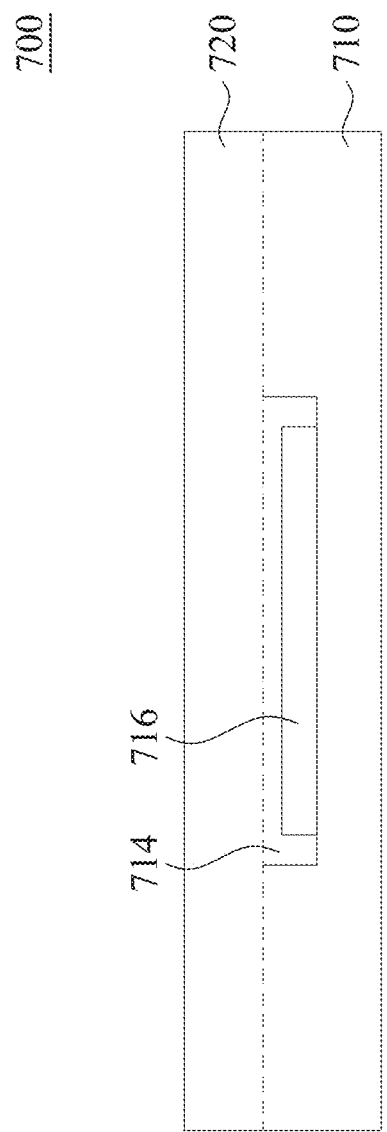
FIG. 7 is a side cross-sectional view showing a multilayer structure produced by plasma treatment and subsequent fusion bonding.

For example, FIG. 7 illustrates an example device 700 where two wafer substrates 710, 720 are bonded together. As illustrated here, the first wafer substrate 710 is a MEMS wafer which contains Micro-Electro-Mechanical Systems, and the second wafer substrate 720 is a capping wafer intended to encapsulate the MEMS device. The first wafer substrate 710 is illustrated as containing a cavity 714 having a MEMS device 716 therein. The MEMS device may include a plurality of elements formed on metal, polysilicon, dielectric, and/or other materials. The MEMS device may include mechanical structures, electrical structures, or fluid structures. The facing surfaces of the two substrates are flattened and cleaned by plasma treatment. The two wafer substrates 710, 720 are then aligned and pressed together to cause bonding between their surfaces, without the presence of any intermediate layers. Initially, the two surfaces bond through van der Waals forces. The two wafer substrates are usually then annealed to strengthen the bond through formation of covalent bonds. The fusion-bonded surface is indicated as a dotted line, with the MEMS device 716 being hermetically sealed within the cavity 714. The final structure can be further processed as desired.

The tools and methods of the present disclosure provide multiple advantages. First, plasma stability is improved. The use of an optical ignitor, such as a laser, provides a consistent source for plasma ignition compared to conventional electrical discharge which is inconsistent and leads to lower stability or greater instability of the plasma. This affects the performance, both in terms of consistency and predictability on a given wafer and across multiple wafers. The triggering of the optical ignitor is easily synchronized with other electrical triggering signals in the plasma treatment tool. Capital costs and operating costs are relatively affordable, and maintenance and downtime is also improved.

Some embodiments of the present disclosure thus relate to methods for using a plasma treatment tool. At least one reactant gas is flowed into a plasma treatment chamber. A laser is used to form a plasma from the at least one reactant gas. The laser operates at a wavelength of about 400 nm or lower and emits optical pulses with an energy of about 20 millijoules (50 mJ) to about 1 joule. A semiconducting wafer substrate within the plasma treatment chamber is thus plasma treated.

Other embodiments of the present disclosure relate to plasma treatment tools. The tools comprise a housing containing a plasma treatment chamber. A gas inlet is used to introduce one or more process gases into the plasma treatment chamber. The tools include an optical module comprising a laser whose light path passes through the plasma treatment chamber. A wafer support pedestal having a wafer support surface and configured to support a substrate is located within the plasma treatment chamber. An upper electrode is located above the wafer support pedestal. A dielectric window separates the upper electrode from the plasma treatment chamber. A lower electrode is located below the wafer support surface.

Also disclosed in various embodiments are plasma etching methods. At least one etchant gas is introduced into a plasma treatment chamber. An electrical field is produced between two electrodes. An optical ignitor is used to ignite a plasma from the at least one etchant gas. The pulses from the optical ignitor are synchronized with the electrical triggering signals that produce the electrical field. A semiconducting wafer substrate within the plasma treatment chamber is then etched.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for using a plasma treatment tool, comprising:
flowing at least one reactant gas into a plasma treatment chamber;
using a laser to form a plasma from the at least one reactant gas, wherein the laser operates at a wavelength of about 400 nm or lower and wherein the laser emits optical pulses with an energy of about 20 millijoules (20 mJ) to about 1 joule and wherein the laser has a peak power output of about 1 terawatt; and
plasma treating a semiconducting wafer substrate within the plasma treatment chamber;
wherein a light path of the laser passes above the semiconducting wafer substrate.

2. The method of claim 1, wherein the laser emits optical pulses with a duration of about one picosecond or less.

3. The method of claim 1, wherein the laser emits optical pulses at a frequency of about 0.1 KHz to about 100 MHz.

4. The method of claim 1, wherein the laser is an excimer laser or a solid state laser.

5. The method of claim 1, wherein the plasma treatment chamber is at a pressure of about 10 millitorr or lower.

6. The method of claim 1, wherein the laser is a semiconductor laser or a fiber laser.

7. The method of claim 1, wherein the laser is contained within an optical module, and the optical module further comprises a beam expander or a beam flattener.

8. The method of claim 1, wherein the laser emits optical pulses with an energy of about 50 mJ.

9. A plasma etching method, comprising:
receiving a substrate;
inserting the substrate into a plasma treatment chamber;
introducing at least one etchant gas into the plasma treatment chamber;
producing an electrical field between two electrodes;
using a laser to form a plasma from the at least one etchant gas, wherein the laser pulses in synchronization with electrical triggering signals that produce the electrical field; and
etching the substrate.

10. The method of claim 9, wherein a patterned photoresist layer is formed upon the substrate prior to the etching.

11. The method of claim 9, wherein the substrate is a semiconducting wafer substrate or a mask substrate.

12. The method of claim 9, wherein the laser provides a photon energy that is higher than an ionization threshold of the at least one etchant gas.

13. The method of claim 9, wherein the laser operates at a wavelength of about 400 nm or lower and wherein the laser emits optical pulses with an energy of about 20 millijoules (20 mJ) to about 1 joule.

14. The method of claim 13, wherein the laser emits optical pulses with an energy of about 50 mJ.

15. A plasma etching method, comprising:
receiving a substrate;
inserting the substrate into a plasma treatment chamber;
introducing at least one etchant gas into the plasma treatment chamber;
producing an electrical field between two electrodes;
using a laser to form a plasma from the at least one etchant gas, wherein the laser pulses in synchronization with electrical triggering signals that produce the electrical field; and
etching the substrate;
wherein a light path of the laser passes between a dielectric window and a skin depth of an electrical field generated between the two electrodes where a value of an electrical current is 0.37 times a value of the electrical current at a surface of one of the two electrodes.

16. The method of claim 15, wherein the laser operates at a wavelength of about 400 nm or lower.

17. The method of claim 15, wherein the laser emits optical pulses with an energy of about 20 millijoules (20 mJ) to about 1 joule.

18. The method of claim 15, wherein the plasma treatment chamber is at a pressure of about 10 millitorr or lower.

19. The method of claim 15, wherein the laser is an excimer laser, a solid state laser, a semiconductor laser, or a fiber laser.

20. The method of claim 15, wherein the laser is contained within an optical module, and the optical module further comprises a beam expander or a beam flattener.

\* \* \* \* \*